United States Patent
Webber et al.

(10) Patent No.: US 10,573,983 B2
(45) Date of Patent: Feb. 25, 2020

(54) FEMALE ELECTRICAL SOCKET CONFIGURATION SUITABLE FOR USE WITH A PCB

(71) Applicant: HARWIN PLC, Portsmouth, Hampshire (GB)

(72) Inventors: Robert Webber, Portsmouth (GB); Sam Bennett, Portsmouth (GB); Kevin Hunt, Portsmouth (GB); Robert Coldrick, Portsmouth (GB); Graham Cunningham, Portsmouth (GB); Mark Plested, Portsmouth (GB); Andrew McQuilken, Portsmouth (GB)

(73) Assignee: HARWIN PLC, Hampshire (GB)

( * ) Notice: Subject to any disclaimer, the term of this patent is extended or adjusted under 35 U.S.C. 154(b) by 0 days.

(21) Appl. No.: 15/950,340

(22) Filed: Apr. 11, 2018

(65) Prior Publication Data
US 2018/0294585 A1 Oct. 11, 2018

(30) Foreign Application Priority Data
Apr. 11, 2017 (GB) .................................. 1705866.0

(51) Int. Cl.
*H01R 12/70* (2011.01)
*H01R 12/71* (2011.01)
(Continued)

(52) U.S. Cl.
CPC ....... *H01R 12/7035* (2013.01); *H01R 12/718* (2013.01); *H01R 13/11* (2013.01);
(Continued)

(58) Field of Classification Search
CPC ............ H01R 12/7035; H01R 12/7064; H01R 12/707; H01R 12/718; H01R 13/187;
(Continued)

(56) References Cited

U.S. PATENT DOCUMENTS

| 4,181,387 A | 1/1980 | Walters ....................... 339/17 C |
| 4,657,366 A | 4/1987 | Johnson et al. .......... 339/258 R |

(Continued)

FOREIGN PATENT DOCUMENTS

| CN | 204103074 U | 1/2015 | ............. H01R 12/73 |
| DE | 10 2013 102 238 A1 | 9/2011 | ............. H01R 12/58 |

(Continued)

OTHER PUBLICATIONS

Machine translation of DE 102013102238A1 Sep. 11, 2014, [database online], [retrieved on Sep. 10, 2018] Retrieved from Espacenet using Internet < http://translationportal.epo.org/emtp/translate/?ACTION=description-retrieval&COUNTRY=DE&ENGINE=google&FORMAT=docdb&KIND=A1&LOCALE=en_EP&NUMBER=102013102238&OPS=ops.epo.org/3.2&SRCLANG=de&TRGLANG=en >.*

(Continued)

*Primary Examiner* — Travis S Chambers
(74) *Attorney, Agent, or Firm* — Renner Kenner Greive Bobak Taylor & Weber

(57) ABSTRACT

A female electrical socket for receiving an electrical pin and for connection to a PCB is provided. The socket provides a body having a first end and a second end, each having an opening, wherein either opening is configured to receive a male electrical pin to form a connection with the female socket, and wherein the body has a central longitudinal axis. The socket further provides a plurality of contact fingers on the body, wherein a first end of each of the fingers is attached to the body and a second end of each of the fingers is radially directed inwards relative to the first end towards the central longitudinal axis to provide a retention force to engage with the electrical pin. At least one wing extends outwardly from the first end of the body. A corresponding method of manufacturing the socket is also provided.

21 Claims, 8 Drawing Sheets

(51) Int. Cl.
    *H01R 43/16*     (2006.01)
    *H01R 13/11*     (2006.01)
    *H01R 43/20*     (2006.01)
    *H05K 1/18*     (2006.01)
    *H01R 12/57*     (2011.01)

(52) U.S. Cl.
    CPC ........... *H01R 13/111* (2013.01); *H01R 43/16* (2013.01); *H01R 43/205* (2013.01); *H05K 1/184* (2013.01); *H01R 12/57* (2013.01); *H05K 2201/10325* (2013.01); *H05K 2201/10583* (2013.01)

(58) Field of Classification Search
    CPC ........ H01R 13/11; H01R 43/16; H05K 1/184; H05K 2201/10325; H05K 2201/10583; H05K 2201/1059
    USPC .......................... 439/870, 843–845, 873, 876
    See application file for complete search history.

(56) References Cited

U.S. PATENT DOCUMENTS 5,071,375 A * 12/1991 Savage, Jr. .......... H01R 13/187
                                                                                       439/853
5,509,814 A * 4/1996 Mosquera ............ H01R 12/58
                                                                                       439/78
5,704,752 A * 1/1998 Logerot ............ F16B 19/1081
                                                                                    411/503
2007/0190868 A1   8/2007  De Cloet et al. ............. 439/851

FOREIGN PATENT DOCUMENTS

| | | | |
|---|---|---|---|
| EP | 0 268 890 | 6/1998 | ............. H01R 9/09 |
| EP | 1 133 010 A1 | 9/2001 | ............. H01R 12/22 |
| FR | 2 613 878 | 10/1988 | ............. H01R 13/02 |
| GB | 956290 | 4/1964 | |
| GB | 1 475 188 | 6/1977 | ............. H05K 1/12 |
| WO | WO 97/24910 | 7/1997 | ............. H05K 1/18 |

OTHER PUBLICATIONS

UK Search Report dated Oct. 10, 2017 in related application No. GB 1705866.0.

Extended European Search Report dated Jun. 14, 2018 in related application No. EP 18166767.6.

* cited by examiner

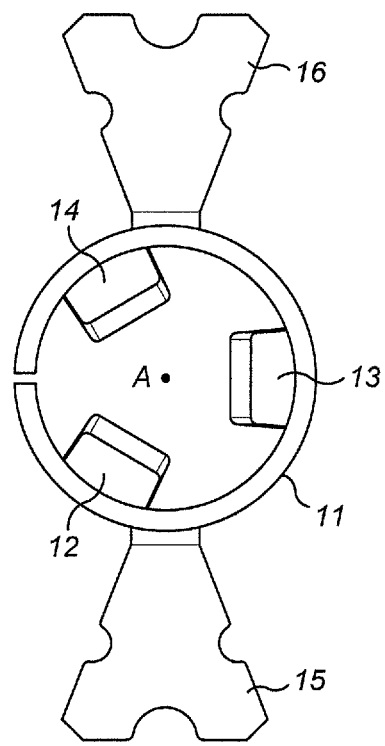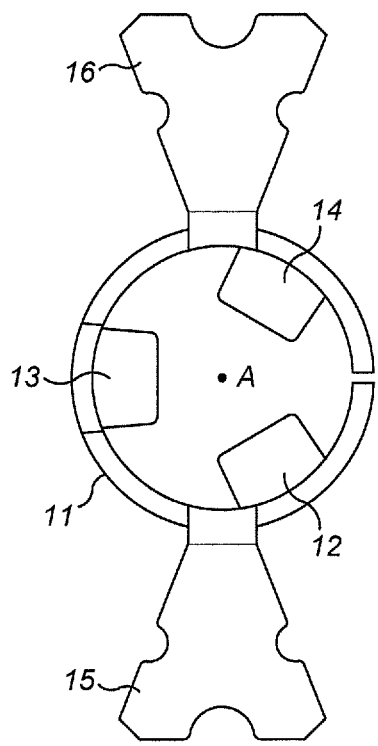
FIG. 3              FIG. 4
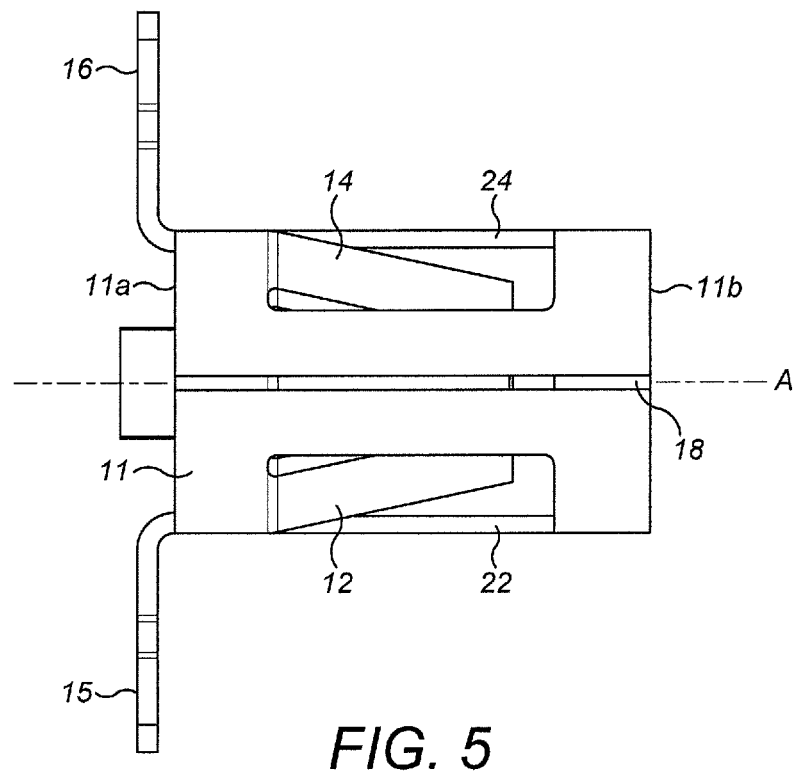
FIG. 5

FEMALE ELECTRICAL SOCKET CONFIGURATION SUITABLE FOR USE WITH A PCB

TECHNICAL FIELD

The present invention relates to electrical sockets and a method of manufacture of such sockets, and in particular to electrical sockets that are suitable for use in printed circuit boards.

BACKGROUND ART

An electrical connection can be made between two electrical devices usually using a male and female electrical contact. One part of the connection has a male contact with an electrical pin and the other part is a female contact in the form of a socket for receiving the male contact.

Printed circuit board (PCB) sockets are known and can be received through a hole in a printed circuit board. A male contact is then received in the socket and engages with the socket. An example of such a socket is the S9101-46R PCB socket sold by Harwin plc. This is a single-piece PCB socket which can receive circular cross section or square cross section male mating pins.

The inventors have arrived at an alternative electrical socket configuration suitable for use with a PCB.

SUMMARY OF THE INVENTION

According to a first aspect of the invention, a female electrical socket for receiving an electrical pin is provided, the socket comprising a body defining an enclosure, the body comprising a first end and a second end each having an opening, wherein the opening of the first end or second end is configured to receive a male electrical pin to form a connection with the female socket, wherein the body has a central longitudinal axis, the socket further comprising a plurality of contact fingers on the body, wherein a first end of each of the fingers is attached to the body and a second end of each of the fingers is radially directed inwards relative to the first end towards the central longitudinal axis whereby in use the fingers provide a retention force to engage with the electrical pin.

According to a second aspect of the invention, a method of manufacturing a female electrical socket is provided, comprising: providing a flat conductive sheet; stamping out a plurality of cutaway portions from the sheet to provide a plurality of contact fingers each comprising a first end attached to the sheet and a second end; moving a first side of the sheet towards a second side of the sheet to form a cylindrical body defining an enclosure, bending the second end of each of the contact fingers radially inwards relative to the first end towards a central longitudinal axis of the cylindrical body.

From a third aspect, a female electrical socket obtained by the aforementioned method is provided. From a fourth aspect, a PCB is provided comprising a female electrical socket as defined hereinbefore, wherein the contact is positioned in a hole in the PCB.

Optional features are provided in the appended dependent claims.

BRIEF DESCRIPTION OF THE DRAWINGS

Embodiments of the invention will now be provided by way of example only with reference to the drawings in which:

FIG. 3 shows a view of the socket of FIG. 1 from one end;
FIG. 4 shows a view of the socket of FIG. 1 from another end to FIG. 3;
FIG. 5 shows a view of the socket of FIG. 1 from one side.

BEST MODE FOR CARRYING OUT THE INVENTION

Figure 1:
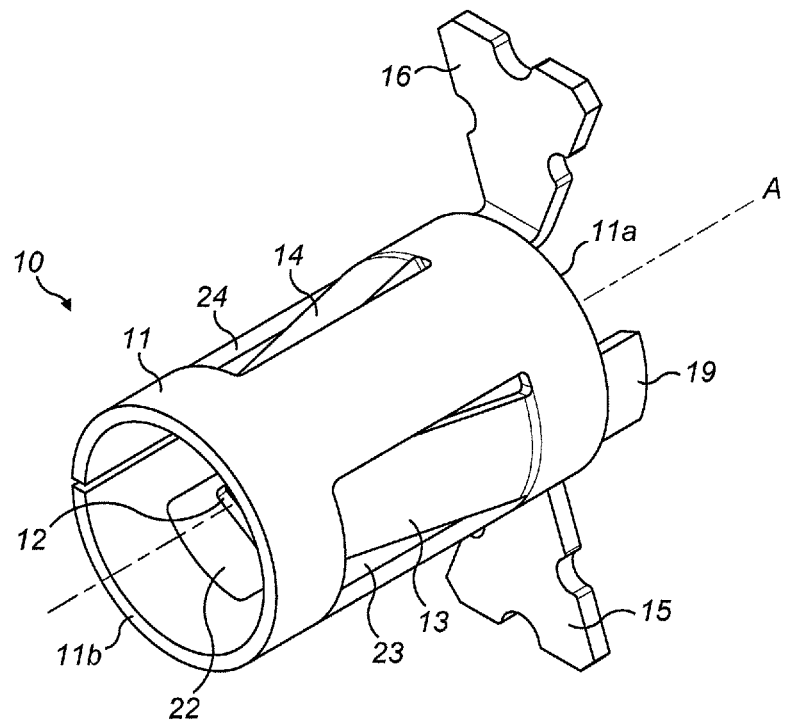
FIG. 1 shows a perspective view of a socket according to a first embodiment.
Figure 2:
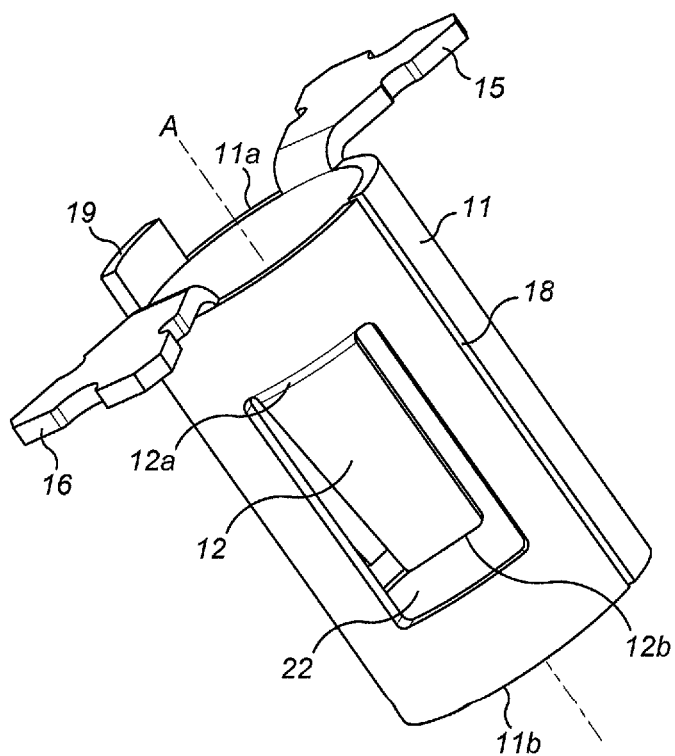
FIG. 2 shows another perspective view of the socket of FIG. 1.
Figure 6:
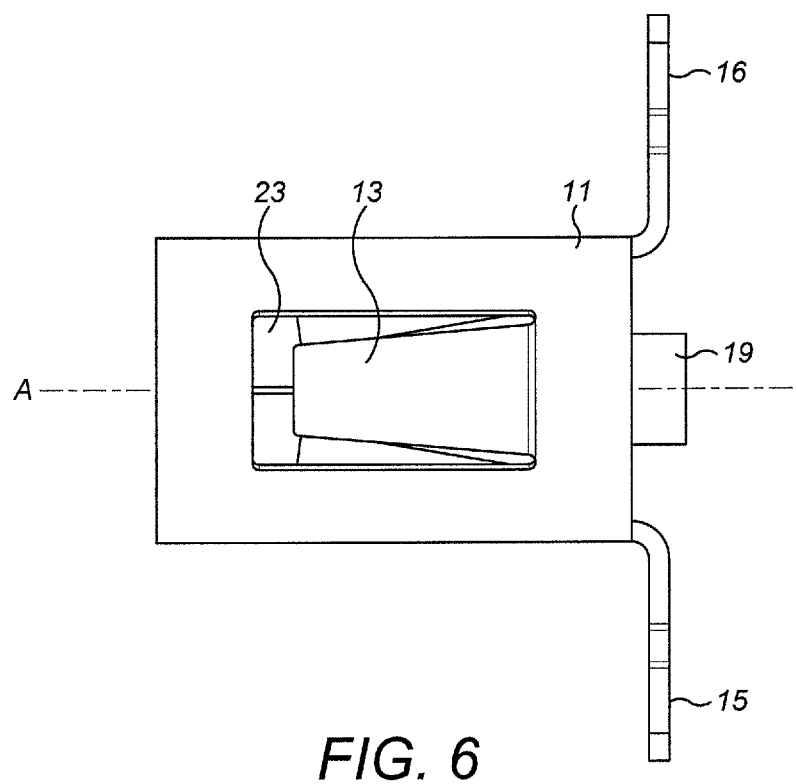
FIG. 6 shows a view of the socket of FIG. 1 from another side to FIG. 5.

A socket 10 of a first embodiment is described in relation to FIGS. 1 to 6 which show various views of the socket 10. The socket 10 is formed from a single piece of material and preferably a flat sheet (described later), at least a portion of which is conductive in order to exhibit electrically conductive functionality as required. One example of an appropriate material is beryllium copper but other conductive materials may be used. In this particular embodiment, the entire sheet is formed of conductive material.

The socket 10 has a body 11 with a cylindrical wall defining a cavity or enclosure within which a male electrical contact (not shown) can be at least partially received. The body 11 is an open-ended hollow cylindrical member. The cylindrical member has a circular cross section in this embodiment. However, in other embodiments, the member may have an elliptic, rectangular or square cross section as appropriate.

The body 11 has a first end 11a and second end 11b each comprising an opening such that there is a through hole in the body and the cylindrical side wall between the first end 11a and second end 11b. The side wall is substantially parallel to a central longitudinal axis A of the body 11 of the socket 10. A plurality of contacts fingers and preferably three contact fingers 12, 13, 14, are provided on the socket 10. The body 11 has three U-shaped cutaway portions 22, 23, 24 corresponding to each respective contact finger 12, 13, 14 such that cutting away of a U-shaped portion from the side wall of the body 11 of the socket 10 leaves a corresponding contact finger 12, 13, 14 which is effectively resiliently mounted at one end to the body 11 and movable relative to the body 11 about one end of the finger 12, 13, 14. Therefore, each finger 12, 13, 14 is attached and integral with the body 11 at only a first end of each contact finger 12, 13, 14. It will be appreciated the fewer or more contact fingers may be provided as well as cutaway portions, and other shaped cutaway portions can be created depending on the shape of contact finger that is desired. In this embodiment, the shape of each of the contact fingers is identical to all of the others such that only one contact finger 12 will be described in detail here. Also, the shape of each of the cutaway portions is identical to all of the others such that only one cutaway portion 22 will be described in detail here. It will be appreciated to the skilled person that different shaped (rather than identical) contact fingers and/or cutaway portions could be provided.

In this embodiment, contact finger 12 has a rectangular shape having a first end 12a and second end 12b. Upper and lower surfaces of the finger 12 is straight and flat in accordance, but this is purely exemplary and, fingers having bends, curves or deformations along their length may also be used. The first end 12a (base) of the contact finger 12 is attached to the body 11 and the second end 12b (tip) is a free end such that the finger 12 can be bent (described later) relative to the first end 12a and the contact finger 12 is effectively hinged at the first end 12a although a specific separate hinge is not provided.

In this embodiment, the first end 12a of the contact finger 12 is proximate the first end 11a of the body 11 and the second end 12b of the contact finger 12 is distal the first end 11a of the body 11. It will be appreciated that the remaining contact fingers 13, 14 have a similar configuration such that the first end of each is attached to the body 11 proximate a first end 11a of the body 11 and the second end of each finger is distal the first end 11a of the body 11 and proximate the second end 11b of the body. In this embodiment, the first end of each contact finger that is attached to the body 11 is spaced equally around the body 11 of the socket 10.

Again referring to the first contact finger 12 only (but the arrangement applying equally to the other fingers 13, 14), in its default position, the second end 12b of the contact finger 12 is radially directed inwards towards the central longitudinal axis A. That is, the first contact finger 12 is at an angle relative to the longitudinal axis A of body 11, such that finger 12 converges towards this longitudinal axis A when moving from the base (first end 12a) of finger 12 (the base of finger 12 being joined to body 11) towards the tip (second end 12b) of finger 12. The second end 12b can act as a lead in or guide for a male component (not shown) during mating, such that the male pin is more easily and readily inserted into socket 10 from opening in the first end 11a of the body 11. A pin or cuboid shaped component can fit through the inside of the socket, and touch onto the fingers 12, 13, 14 which will provide a retention force and an electrical contact depending on the materials used.

In some embodiments, the second end of each contact finger may comprise a tapered portion that tapers towards the longitudinal axis A of body 11, with the thinner end of the tapered portion forming the tip of the contact finger (and hence the end of finger). Other profiles of the tip of the contact finger may also be used so long as they are able to accommodate a male pin.

As shown in more detail in FIGS. 3 and 4, fingers 12, 13, 14 are arranged at regular 120 degree intervals around the circumference of body 11. This arrangement is purely exemplary and other arrangements incorporating different numbers of fingers spaced at different angles and having regular or irregular angular distributions of fingers may also be used.

In use, a male pin (not shown) is inserted within the cavity defined by fingers 12, 13, 14 and is held in position by these fingers.

In the first embodiment, there is a slit 18 in the side wall of the body 11, which extends from the first end 11a to the second end 11b of the body 11. This slit 18 can be a result of the manufacture of the socket 10 where the body is formed by rolling a sheet of material and the slit is a gap between two sides of the rolled sheet.

Figure 9:
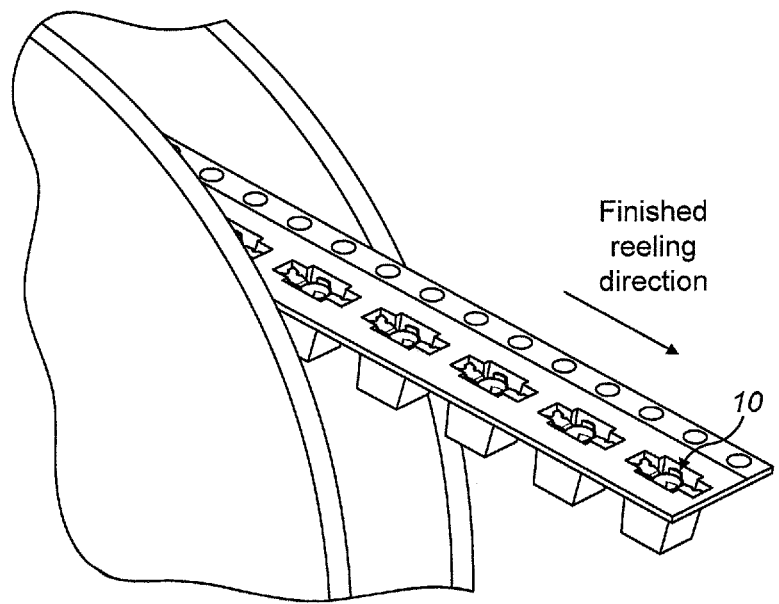
FIG. 9 shows a perspective view of a reel housing that can be used to house a plurality of sockets of FIG. 1.

The FIGS. 1-7 show an extrusion 19 that extends axially beyond the first end 11a of the body 11. This represents a portion that may remain after the socket has been detached from a tape and reel bandolier (example shown in FIG. 9) before being placed in a PCB 20. The extrusion may not be provided.

Figure 7:
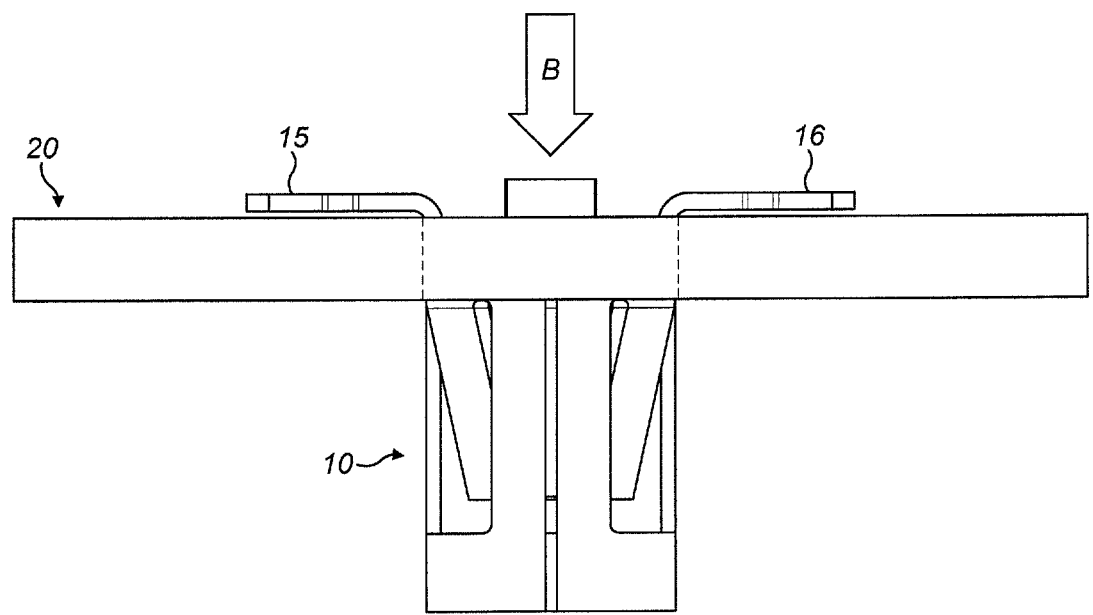
FIG. 7 shows a partial side view of a printed circuit board and the socket of FIG. 1 in position and connected to PCB.

As shown in FIGS. 1-7, the socket 10 also has outwardly extending members or wings 15, 16 diametrically opposite each other that can be used to fix the socket 10 to a PCB 20 (as shown in the example of FIG. 7). The wings 15, 16 extend radially outwardly from the first end 11a of the body 11 and can be shaped such that the body 11 of the socket 10 is received through a through hole (see dashed line in FIG. 7) in a PCB 20 and a surface of each wing 15, 16 abuts a surface of the PCB 20 prevents the socket 10 from moving further through the hole in the PCB 20. The through hole may correspond to the cross sectional shape of the body 11 so may be circular. The wings 15, 16 can be electrically connected to electrical traces on the PCB 20 if required. In addition, the wings 15, 16 can be formed from the same single piece of flat material as the body 11. Although two wings 15, 16 are shown in the figures, fewer or more wings may be provided. The socket 10 is fixed in the hole in the PCB 20 and the socket 10 can then receive a male pin or other similar component into the socket 10 such that the pin and socket are received in a perpendicular direction B to the surface of the PCB 20.

Wings 15, 16 also may have an additional functionality wherein the socket 10 can be picked up and retained either by suction or by a mechanical grip (not shown). An example of when this would be useful is during manufacture of electronic products for PCB automated assembly. The retention either by suction or by mechanical grip can be made either simultaneously on both wings, or on a single wing. A potential way of using both wings simultaneously for retention may be by a split vacuum tube offering suction. The advantage of this function is to enable automatic assembly by a pick and place method however without the need for pick and place caps or tape which can add costs to the product and increasing manufacturing costs by needing to remove the caps or tape. Therefore, the wings 15, 16, they have a dual functionality: connecting the socket to a printed circuit board and for enabling the socket to be picked up and retained either by suction or by a mechanical grip.

The diameter of body 11 is a few millimetres, but this is purely exemplary to provide an indication on the scale that the embodiment can be manufactured and utilised. Other sizes are also possible with the necessary changes having been made.

Figure 8:
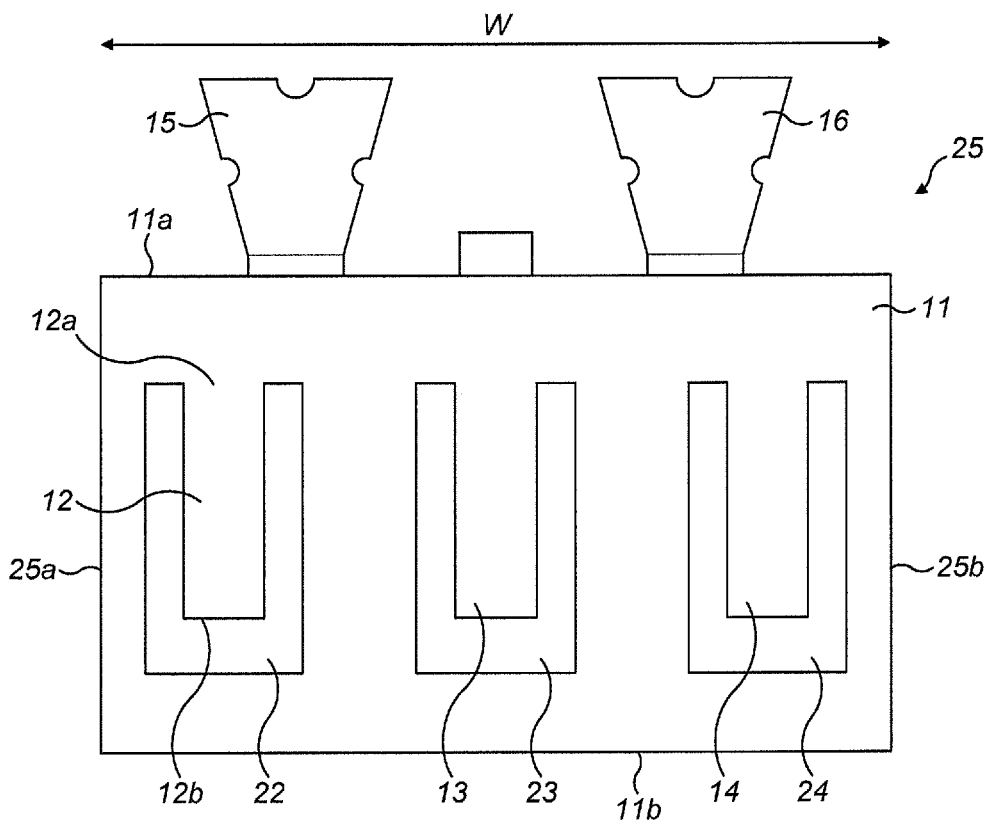
FIG. 8 shows a view of a shaped flat sheet that could be used to make the socket of or similar to that in FIG. 1.

One way to manufacture the socket 10 is from a single stamped and formed piece of metal that may be a flat conductive sheet 25 as shown in FIG. 8 which will now be explained in more detail. The three contact fingers 12, 13, 14 are stamped into shape on the sheet 25. This can be achieved by creating the three cutaway portions 22, 23, 24 in the sheet and these cutaway portions are generally U-shaped. The contact fingers 12, 13, 14 are symmetrically spaced along a first dimension of the sheet which in this embodiment is along the width W of the sheet 25. Note that the shape of the fingers 12, 13, 14 is only shown to explain one embodiment of manufacture and the invention is not limited to the particular shape in FIG. 8.

The outwardly extending members or wings 15, 16 that can be used to fix the socket 10 to a PCB 20 (as shown in the example of FIG. 7) are also stamped from the sheet 25 to leave the blank that can be used to create the socket 10. The first wing 15 extends in a direction perpendicular to the dimension W from the first end 11a proximate a base of the contact finger 12 and the second wing 16 extends in a direction perpendicular to the dimension W from the first end 11a proximate a base of the contact finger 14 such that when the sheet 25 is rolled to form a cylinder (explained in more detail below), the wings are diametrically opposite each other whilst the contact fingers are arranged at regular 120 degree intervals around the circumference of body 11. The wings 15, 16 can be formed from the same single piece of flat material as the body 11 but it will be appreciated that they may be made from a different material although still part of the same sheet as the rest of the socket (this could be more difficult to manufacture but is conceivable). It will be appreciated that although two wings are shown diametrically opposite each other in the figures, there may be fewer or more wings and the wings could be at different angles (rather than being diametrically opposite) and still achieve the function of assisting in the mounting of the socket to the PCB 20.

One side 25a of the sheet can be moved or rolled towards another side 25b to form a cylindrical tubular shaped body 11 with a wall defining a cavity or enclosure within which a male pin can be at least partially received. Both sides 25a, 25b are substantially parallel to each other and when they are brought together, they are directly adjacent each other. In this embodiment, the sides are arranged to leave the gap 18 therebetween although in other embodiments, they may be in contact.

The tip of each contact finger 12, 13, 14 can then be brought radially inwards towards the central longitudinal axis A of the socket 10 such that they remain in a default position where they are angled inwards. The extent to which they are brought inwards can be based on the male pin diameters that are intended to be used with the socket and can be varied at manufacture.

The wings 15, 16 can then be bent at approximately ninety degrees to the longitudinal axis A such that they extend radially outwards from the body 11 at the first end 11a of the body.

Figure 10:
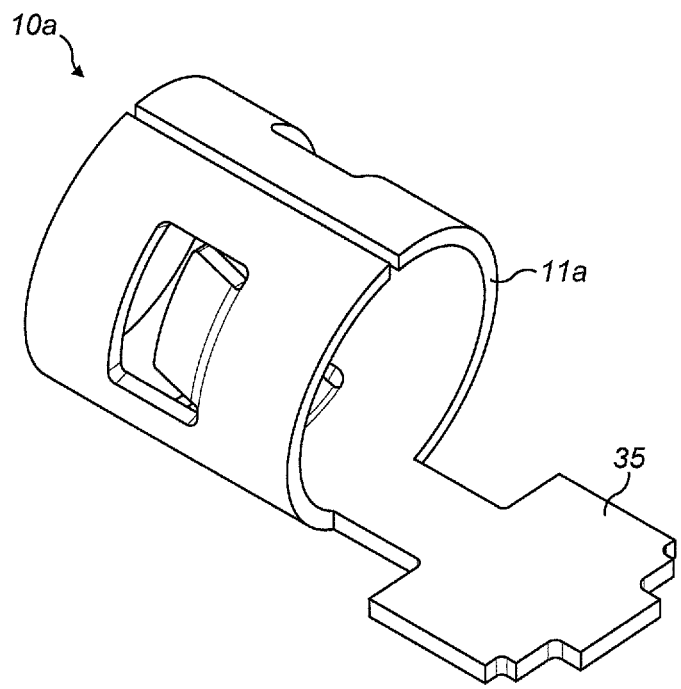
FIG. 10 shows a perspective view of a modified contact with a modified wing arrangement.
Figure 11:
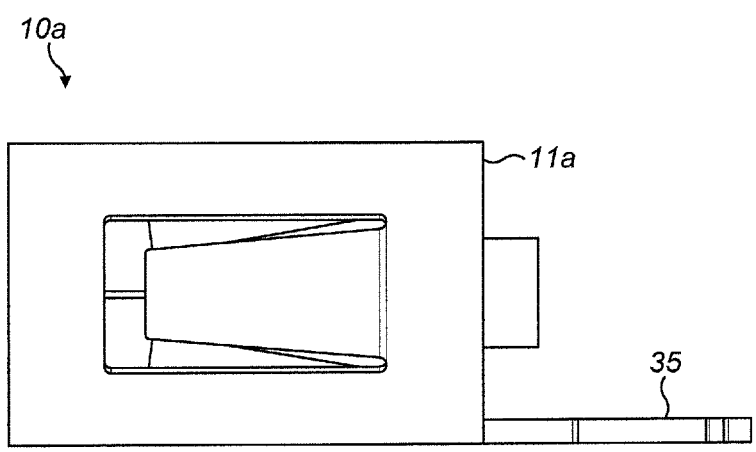
FIG. 11 shows another view of the modified contact of FIG. 10.

In a modification shown in FIGS. 10 and 11, a single wing 35 may be provided instead of multiple wings 15, 16. Furthermore, the wing 35 may be oriented or bent differently to the wings 15, 16 which are arranged such that a longitudinal axis A of the contact 10 is perpendicular to the surface of a PCB to which the contact 10 is mounted when is use. Specifically, the wing 35 is arranged such that the contact 10a is parallel to the surface of the PCB (not shown in FIGS. 10 and 11) when the wing 35 is mounted to the PCB. The wing 35 extends outwardly from the first end 11a of the contact 10a but in this configuration the surface of the wing is substantially parallel to the longitudinal axis of the contact 10a so as to allow parallel mounting to a PCB surface. Only the wing feature is different compared to the wings in contact 10 and therefore other features of the contact shown in FIGS. 10 and 11 have not been described in detail. It will be appreciated that a plurality of wings that are in a parallel configuration may be provided instead of a single wing 35. A combination of wings with different orientations may also be provided depending on the PCB configuration that is desired.

The order of the manufacture steps may be changed and the above is provided as an example only.

The above embodiment describes a socket 10 with contact fingers 12, 13, 14 in a first direction relative to a first end 11a of the socket 10 where a male pin is received through the first end 11a. However, in another alternative embodiment, the contact fingers can be adapted to be directed in a second direction opposite to the first direction, however, their functionality is effectively the same as those in the first embodiment and are not described in detail here. That is, the base of each contact finger in the alternative embodiment is proximate a second end of the socket opposite the first end 11a. FIGS. 12 to 15 show the alternative embodiment which is an alternative socket 30 which is identical to the socket 10 except that the contacts fingers are directed in the opposite direction to the first embodiment. It will be clear to the skilled person that the FIGS. 12 to 15 correspond to FIGS. 1, 2, 5 and 8 respectively except that the contact fingers are in opposite directions, therefore, for brevity, only contact fingers 32, 33, 34 and corresponding cutaway portions 42, 43, 44 are discussed. Like reference numerals are used to refer to the same features from the first embodiment.

Figure 12:
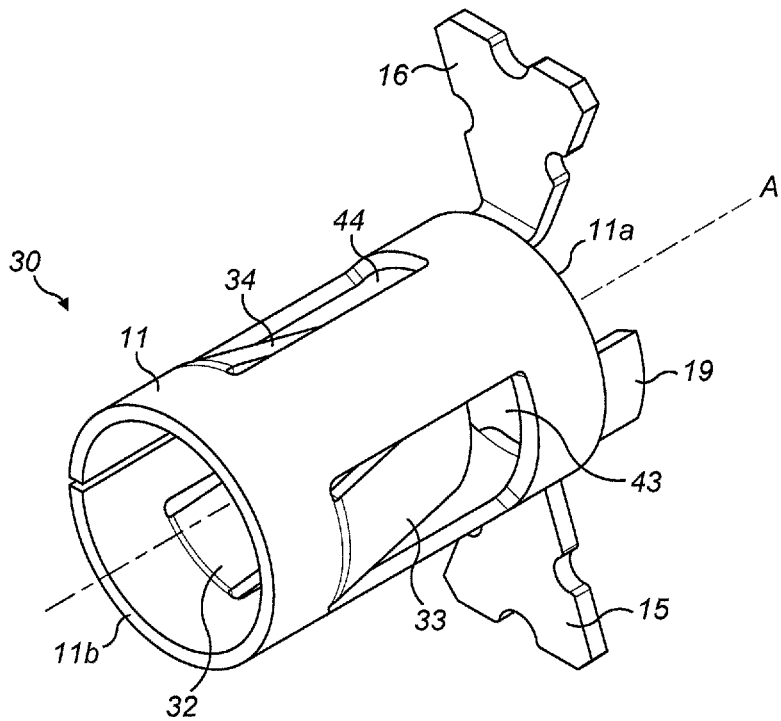
FIG. 12 shows a perspective view of a socket according to an alternative embodiment.
Figure 13:
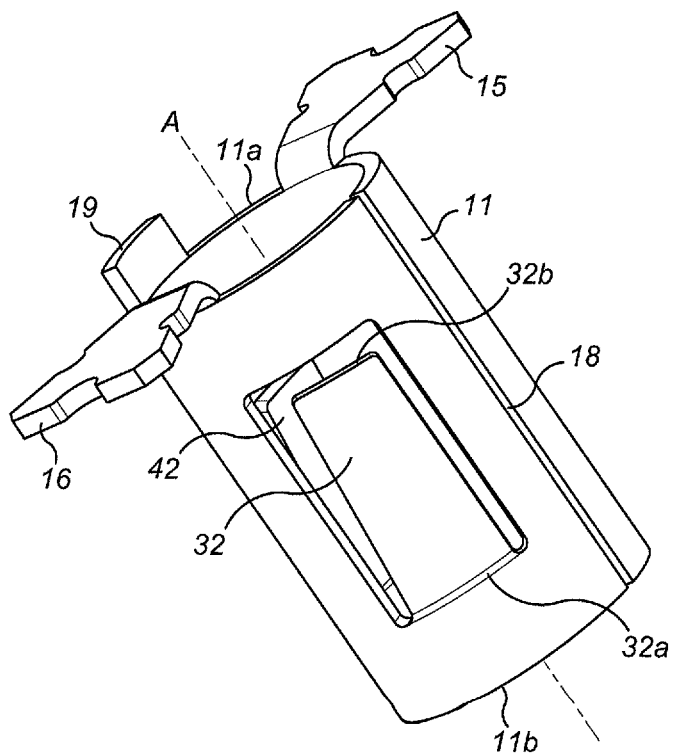
FIG. 13 shows another perspective view of the socket of FIG. 12.
Figure 14:
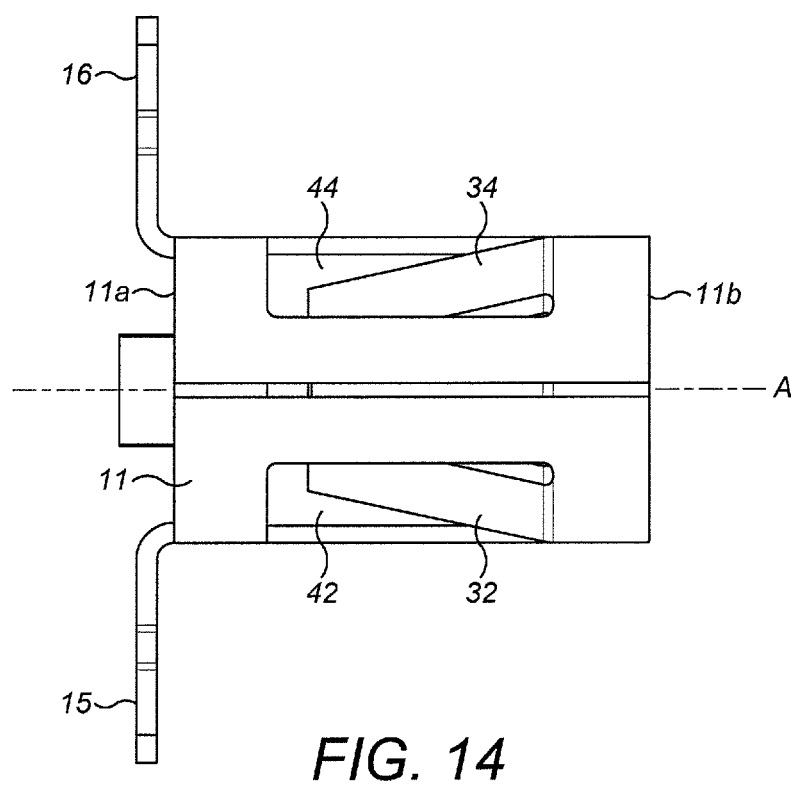
FIG. 14 shows a view of the socket of FIG. 12 from one end.

As shown particularly in FIG. 12, first end 32a of the contact finger 32 is proximate the second end 11b of the body 11 (distal the first end 11a of the body 11) and the second end 32b of the contact finger 32 is distal the second end 11b of the body 11 (proximate the first end 11a of the body 11). It will be appreciated that the remaining contact fingers 33, 34 have a similar configuration such that the first end of each is attached to the body 11 proximate a second end 11b of the body 11 and the second end of each finger is distal the second end 11b of the body 11 and proximate the first end 11a of the body 11. In this embodiment, the first end of each contact finger that is attached to the body 11 is spaced around the body 11 of the alternative socket 30. In one embodiment, each first end is spaced equally, however, other spacings or different angles may be provided.

Similarly to the first embodiment, the body 11 has three U-shaped cutaway portions 42, 43, 44 corresponding to each respective contact finger 32, 33, 34 such that cutting away of a U-shaped portion from the side wall of the body 11 of the socket 30 leaves a corresponding contact finger 32, 33, 34 which is effectively resiliently mounted at one end to the body 11 and movable relative to the body 11 about one end of the finger 32, 33, 34. It will be appreciated that although three contacts and cutaway portions are described in this embodiment, the number can vary.

Figure 16:
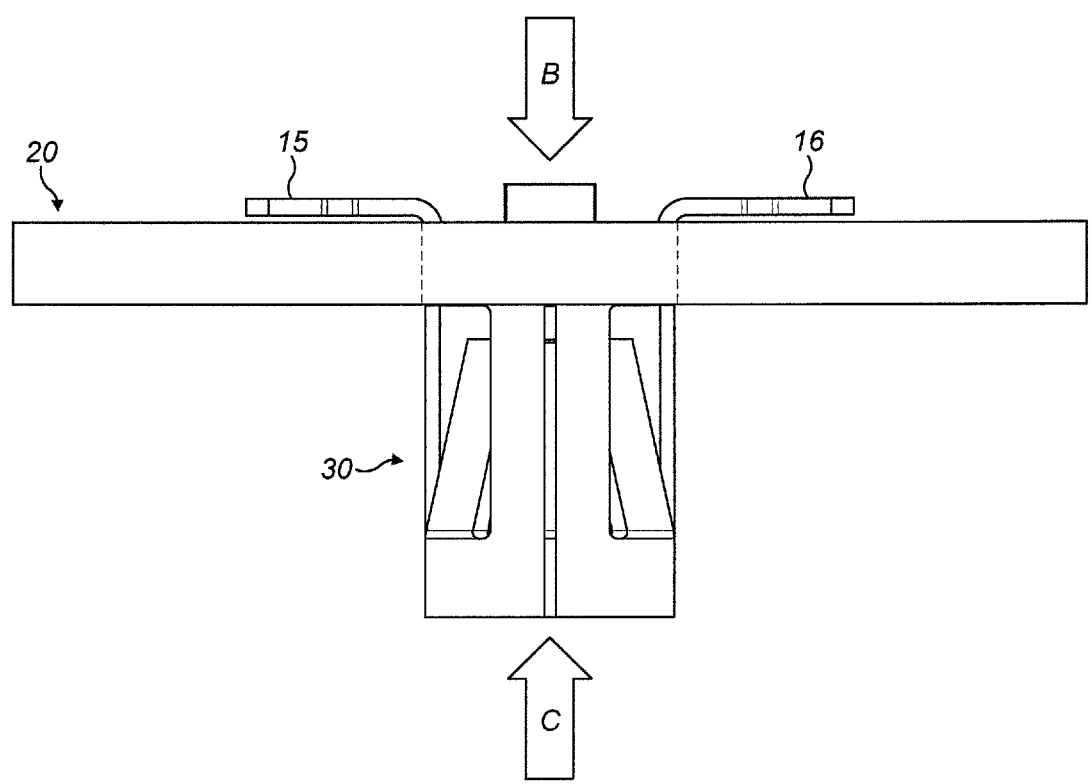
FIG. 16 shows a partial side view of a printed circuit board and the socket of FIG. 12 in position and connected to PCB.

The alternative socket 30 also has outwardly extending members or wings 15, 16 diametrically opposite each other that can be used to fix the alternative socket 30 to a PCB 20 (as shown in the example of FIG. 16). The wings 15, 16 extend radially outwardly from the first end 11a of the body 11 and can be shaped such that the body 11 of the alternative socket 30 is received through a through hole (see dashed line in FIG. 16) in a PCB 20 and a surface of each wing 15, 16 abuts a surface of the PCB 20 prevents the alternative socket 30 from moving further through the hole in the PCB 20. The wings 15, 16 can be electrically connected to electrical traces on the PCB 20 if required. In addition, the wings 15, 16 can be formed from the same single piece of flat material as the body 11. Although two wings 15, 16 are shown in the figures, fewer or more wings may be provided. The socket 10 is fixed in the hole in the PCB 20 and the alternative socket 30 can then receive a male pin or other similar component into the alternative socket 30 such that the alternative socket 30 is received in a first perpendicular direction B to the surface of the PCB 20 (as in the first embodiment) and the pin is received in a second perpendicular direction C to the surface of the PCB 20, opposite the first perpendicular direction.

Similarly to the first embodiment, wings 15, 16 also may have an additional functionality wherein the alternative socket 30 can be picked up and retained either by suction or by a mechanical grip (not shown). An example of when this would be useful is during manufacture of electronic products for PCB automated assembly. The retention either by suction or by mechanical grip can be made either simultaneously on both wings, or on a single wing. A potential way of using both wings simultaneously for retention may be by a split vacuum tube offering suction. The advantage of this function is to enable automatic assembly by a pick and place method however without the need for pick and place caps or tape which can add costs to the product and increasing manufacturing costs by needing to remove the caps or tape.

Nevertheless, it will be appreciated that similarly to the first embodiment, the alternative socket 30 may be provided on a tape and reel bandolier (example shown in FIG. 9) before being placed in a PCB 20.

Figure 15:
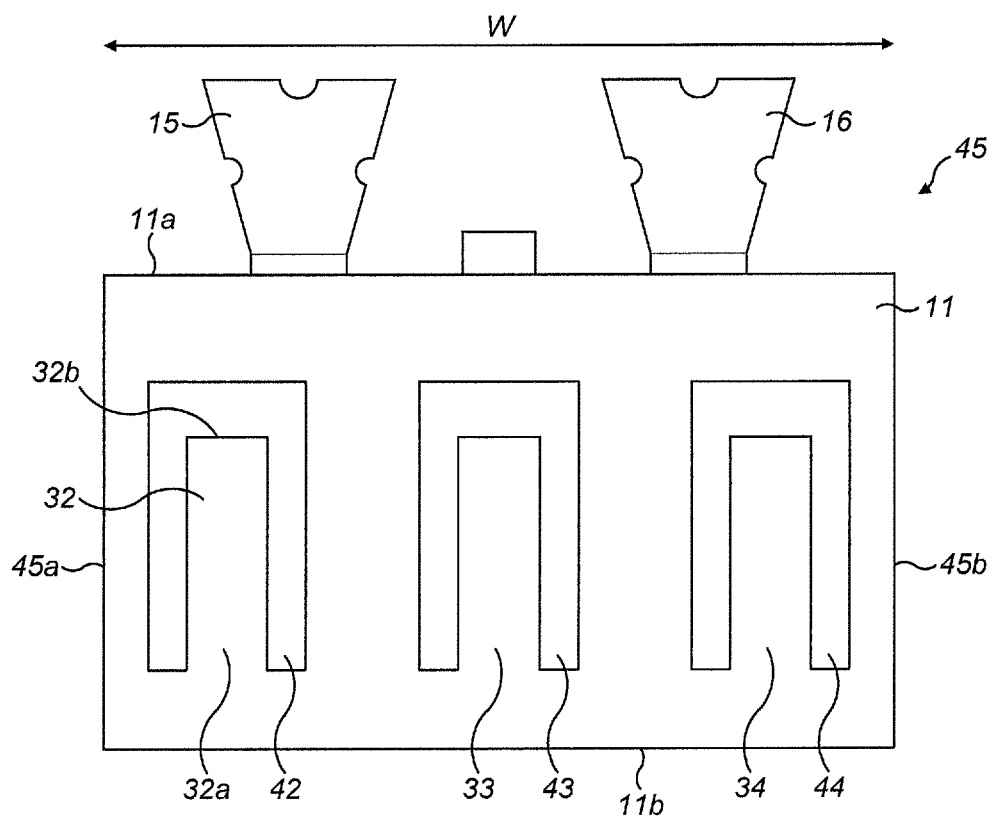
FIG. 15 shows a view of a shaped flat sheet that could be used to make the socket of or similar to that in FIG. 12.

As with the first embodiment, one way to manufacture the alternative socket 30 is from a flat conductive sheet 45 as shown in FIG. 15 which will now be explained in more detail. The three contact fingers 32, 33, 34 are stamped into shape on the sheet 45. Three cutaway portions 42, 43, 44 can be created in the sheet and these cutaway portions are generally U-shaped. The contact fingers 32, 33, 34 are symmetrically spaced along a first dimension of the sheet which in this embodiment is along the width W of the sheet 45. Note that the shape of the fingers 32, 33, 34 and cutaway portions is only shown to explain one embodiment of manufacture and the invention is not limited to the particular shape in FIG. 15.

The outwardly extending members or wings 15, 16 that can be used to fix the alternative socket 30 to a PCB 20 (as shown in the example of FIG. 16) are also stamped from the sheet 45 to leave the blank that can be used to create the alternative socket 30. The first wing 15 extends in a direction perpendicular to the dimension W from the first end 11a proximate an end of the contact finger 32 and the second wing 16 extends in a direction perpendicular to the dimension W from the first end 11a proximate an end of the contact finger 34 such that when the sheet 45 is rolled to form a cylinder (explained in more detail below), the wings are diametrically opposite each other whilst the contact fingers are arranged at regular 120 degree intervals around the circumference of body 11. The wings 15, 16 can be formed from the same single piece of flat material as the body 11 but it will be appreciated that they may be made from a different material although still part of the same sheet as the rest of the alternative socket (this could be more difficult to manufacture but is conceivable). It will be appreciated that although two wings are shown diametrically opposite each other in the figures, there may be fewer or more wings and the wings could be at different angles (rather than being diametrically opposite) and still achieve the function of assisting in the mounting of the socket to the PCB 20.

One side 45a of the sheet can be moved or rolled towards another side 45b to form a cylindrical tubular shaped body 11 with a wall defining a cavity or enclosure within which a male pin can be at least partially received. Both sides 45a, 45b are substantially parallel to each other and when they are brought together, they are directly adjacent each other. In this embodiment, the sides are arranged to leave the gap 18 therebetween although in other embodiments, they may be in contact.

The tip of each contact finger 32, 33, 34 can then be brought radially inwards towards the central longitudinal axis A of the alternative socket 30 such that they remain in a default position where they are angled inwards. The extent to which they are brought inwards can be based on the male pin diameters that are intended to be used with the alternative socket and can be varied at manufacture.

As with the modification described in relation to FIGS. 10 and 11, a similar modification can be applied to the wing arrangement of the alternative socket 30. Specifically, in a modification (not shown) instead of two wings 15, 16, a single wing may be provided that is oriented or bent differently to the wings 15, 16 which are arranged such that a longitudinal axis A of the alternative socket 30 is perpendicular to the surface of a PCB to which the alternative socket 30 is mounted when in use. Specifically, the wing is arranged such that the alternative socket is parallel to the surface of the PCB when the wing is mounted to the PCB. The wing in the alternative socket extends outwardly from the first end of the alternative socket but in this configuration the surface of the wing is substantially parallel to the longitudinal axis of the alternative socket so as to allow parallel mounting to a PCB surface.

As is apparent from the above embodiments, the socket is formed of a single piece of material, can have a circular outer shape created three or more internal contact fingers with the distance the contact fingers protrude towards the central longitudinal axis being variable at manufacture, and can be used for both mechanical retention and electrical contact of a male pin and to a through hole in a PCB.

In addition to the embodiments of the invention described in detail above, the skilled person will recognize that various features described herein can be modified and/or combined with additional features, and the resulting additional embodiments of the invention are also within the scope of the accompanying claims.

Embodiment 1

A female electrical socket for receiving an electrical pin and for connection to a PCB, the socket comprising a body defining an enclosure, the body comprising a first end and a second end each having an opening, wherein the opening of the first end or second end is configured to receive a male electrical pin to form a connection with the female socket, wherein the body has a central longitudinal axis, the socket further comprising a plurality of contact fingers on the body, wherein a first end of each of the fingers is attached to the body and a second end of each of the fingers is radially directed inwards relative to the first end towards the central longitudinal axis whereby in use the fingers provide a retention force to engage with the electrical pin, further comprising at least one wing extending outwardly from the first end of the body, the wing for connecting the socket to a printed circuit board and also for being picked and retained either by a suction or mechanical gripper.

Embodiment 2

The socket of embodiment 1, wherein the body is an open-ended hollow cylindrical member.

Embodiment 3

The socket of embodiment 2, wherein the cylindrical member has a circular, elliptic, rectangular or square cross section.

Embodiment 4

The socket of any preceding embodiment, wherein the body comprises a side wall between the first end and second end of the body.

Embodiment 5

The socket of embodiment 4, wherein the side wall is substantially parallel to the central longitudinal axis of the socket.

Embodiment 6

The socket of embodiment 4 or 5, wherein the side wall comprises a slit extending from the first end to the second end of the body.

Embodiment 7

The socket of any preceding embodiment, wherein the second end of each respective contact finger is a free end that is hinged at the first end of the contact finger.

Embodiment 8

The socket of any preceding embodiment, wherein the body comprises cutaway portions.

Embodiment 9

The socket of embodiment 8, wherein each cutaway portion corresponds to a respective contact finger and each contact finger is formed by cutting away the respective cutaway portion from the body leaving a corresponding contact finger.

Embodiment 10

The socket of any preceding embodiment, wherein the socket comprises at least three contact fingers.

Embodiment 11

The socket of any preceding embodiment, wherein the body forms a cylindrical enclosure.

Embodiment 12

The socket of any preceding embodiment, wherein the at least one wing extending outwardly in a longitudinal direction from the first end of the body.

Embodiment 13

The socket of any of embodiments 1 to 11, wherein there are a plurality of wings extending radially outwardly from the body, for connection of the socket to a printed circuit board.

Embodiment 14

The socket of any preceding embodiment, wherein the first end of each contact finger is proximate the first end of the body and the second end of each contact finger is distal the first end of the body.

Embodiment 15

The socket of any of embodiments 1 to 13, wherein the first end of each contact finger is proximate the second end of the body and the second end of each contact finger is distal the second end of the body.

Embodiment 16

The socket of any preceding embodiment, wherein the socket is formed from a single piece of material.

Embodiment 17

The socket of any preceding embodiment, wherein at least one of the plurality of contact fingers is formed from the same material as the body of the socket.

Embodiment 18

A method of manufacturing a female electrical socket, comprising: providing a flat conductive sheet; stamping out a plurality of cutaway portions from the sheet to provide a plurality of contact fingers each comprising a first end attached to the sheet and a second end; moving a first side of the sheet towards a second side of the sheet to form a cylindrical body defining an enclosure, bending the second end of each of the contact fingers radially inwards relative to the first end towards a central longitudinal axis of the cylindrical body, further comprising stamping out at least one wing from the sheet, the wing extending outwardly from the first end of the body.

Embodiment 19

The method of embodiment 18, wherein the body comprises cutaway portions.

Embodiment 20

The method of embodiment 20, wherein each cutaway portion corresponds to a respective contact finger and each contact finger is formed by cutting away the respective cutaway portion from the body leaving a corresponding contact finger.

Embodiment 21

The method of any of embodiments 19 to 20, further comprising bending the wing radially outwards from the body.

Embodiment 22

The method of embodiment 21, wherein there are a plurality of wings stamped out from the sheet and each wing is bent to extend radially outwardly from the body.

Embodiment 23

The method of any of embodiments 19 to 22, wherein the first end of each contact finger is proximate the first end of the body and the second end of each contact finger is distal the first end of the body.

Embodiment 24

The method of any of embodiments 19 to 22, wherein the first end of each contact finger is proximate the second end of the body and the second end of each contact finger is distal the second end of the body.

Embodiment 25

The method of any preceding embodiment, wherein the socket is formed from a single piece of material.

Embodiment 26

A socket for a print circuit board, obtained by a method according to any of embodiments 18 to 25.

Embodiment 27

A printed circuit board comprising a socket according to any of embodiments 1 to 17 or 26, wherein the socket is positioned in a through hole in the PCB.

The invention claimed is:

1. A female electrical socket for receiving a male electrical pin and for connection to a printed circuit board, the female electrical socket comprising a body defining an enclosure, the body comprising a first end and a second end each having an opening, wherein the opening of the first end or second end is configured to receive the male electrical pin to form a connection with the female electrical socket, wherein the body has a central longitudinal axis, the female electrical socket further comprising three contact fingers on the body, wherein a first end of each of the contact fingers is attached to the body and a second end of each of the contact fingers is radially directed inwards relative to the first end towards the central longitudinal axis whereby in use the three contact fingers provide a retention force to engage with the male electrical pin, further comprising at least one wing extending outwardly from the first end of the body, the wing for connecting the female electrical socket to the printed circuit board and also having a flat surface extending outwardly and sufficiently sized for being picked and retained either by a suction or mechanical gripper, wherein the body comprises a side wall between the first end and second end of the body and an entirety of the side wall is substantially parallel to the central longitudinal axis of the female electrical socket.

2. The female electrical socket of claim 1, wherein the body is a cylindrical member which has a circular, elliptic, rectangular or square cross section.

3. The female electrical socket of claim 1, wherein the side wall comprises a slit extending from the first end to the second end of the body.

4. The female electrical socket of claim 1, wherein the second end of each respective contact finger is a free end that is hinged at the first end of the contact finger.

5. The female electrical socket of claim 1, wherein the at least one wing extending outwardly in a longitudinal direction from the first end of the body.

6. The female electrical socket of claim 1, wherein the at least one wing extends radially outwardly from the first end of the body or there are a plurality of wings extending radially outwardly from the body, for connection of the female electrical socket to the printed circuit board, and wherein the at least one wing is substantially triangular in shape.

7. The female electrical socket of claim 1, wherein the first end of each contact finger is proximate the first end of the body and the second end of each contact finger is distal the first end of the body.

8. The female electrical socket of claim 1, wherein the first end of each contact finger is proximate the second end of the body and the second end of each contact finger is distal the second end of the body.

9. The female electrical socket of claim 1, wherein the female electrical socket is formed from a single piece of material.

10. The female electrical socket of claim 1, wherein at least one of the three contact fingers is formed from the same material as the body of the female electrical socket.

11. The socket of claim 1, wherein a pair of wings extend outwardly from the first end of the cylindrical body and are diametrically opposed to one another, and wherein the three contact fingers are all misaligned with respect to the pair of wings.

12. The female electrical socket of claim 1, wherein the body comprises cutaway portions.

13. The female electrical socket of claim 12, wherein each cutaway portion corresponds to a respective contact finger and each contact finger is formed by cutting away the respective cutaway portion from the body leaving a corresponding contact finger.

14. A method of manufacturing a female electrical socket, comprising:
providing a flat conductive sheet;
stamping out a plurality of cutaway portions from the sheet to provide at least three contact fingers each comprising a first end attached to the sheet and a second end;
moving a first side of the sheet towards a second side of the sheet to form a cylindrical body defining an enclosure;
bending the second end of each of the contact fingers radially inwards relative to the first end towards a central longitudinal axis of the cylindrical body, the cylindrical body comprising a first end and a second end each having an opening, wherein the opening of the first end or second end of the cylindrical body is configured to receive a male electrical pin to form a connection with the female electrical socket, wherein the cylindrical body comprises a side wall between the first end and second end of the cylindrical body and an entirety of the side wall is substantially parallel to the central longitudinal axis of the female electrical socket; and
stamping out at least one wing from the sheet, the wing having a flat surface extending outwardly from the first end of the cylindrical body.

15. The method of claim 14, wherein each cutaway portion corresponds to a respective contact finger and each contact finger is formed by cutting away the respective cutaway portion from the cylindrical body leaving a corresponding contact finger.

16. The method of claim 14, wherein the first end of each contact finger is proximate the first end of the cylindrical body and the second end of each contact finger is distal the first end of the cylindrical body.

17. The method of claim 14, wherein the first end of each contact finger is proximate the second end of the cylindrical body and the second end of each contact finger is distal the second end of the cylindrical body.

18. The method of claim 14, wherein the female electrical socket is formed from a single piece of material.

19. The method of claim 14, further comprising:
   during stamping a pair of wings are formed from the sheet so that upon completion of the moving step the pair of wings are diametrically opposed to one another and the three contact fingers are misaligned with respect to the pair of wings.

20. The method of claim 14, further comprising bending the wing outwards from the cylindrical body.

21. The method of claim 20, wherein the wing is bent radially outwards from the cylindrical body, or there are a plurality of wings stamped out from the sheet and each wing is bent to extend radially outwardly from the body, and each wing is substantially triangular in shape.

* * * * *